United States Patent [19]
Murphey

[11] Patent Number: 6,028,516
[45] Date of Patent: Feb. 22, 2000

[54] TRIGGER CIRCUIT

[76] Inventor: James D. Murphey, 2438 W. Butler, Phoenix, Ariz. 85021

[21] Appl. No.: 09/164,825

[22] Filed: Oct. 1, 1998

[51] Int. Cl.[7] .............................. G08B 13/18; G06M 7/00
[52] U.S. Cl. ..................... 340/555; 340/556; 250/214 B; 250/221
[58] Field of Search ................................... 340/551, 555, 340/556, 572.1, 572.2, 573.1, 545.1, 545.3; 250/222.1, 214 A, 214 B, 221

[56] References Cited

U.S. PATENT DOCUMENTS

| | | | |
|---|---|---|---|
| 4,871,054 | 10/1989 | Murray | 194/212 |
| 4,879,461 | 11/1989 | Philipp | 340/555 |
| 5,126,555 | 6/1992 | Hawryluk | 340/556 |
| 5,139,384 | 8/1992 | Tuttobene | 414/281 |
| 5,268,568 | 12/1993 | Lee | 250/214 B |
| 5,382,163 | 1/1995 | Putnam | 433/215 |
| 5,415,264 | 5/1995 | Menoud | 194/217 |
| 5,416,316 | 5/1995 | Kappeler | 340/556 |
| 5,780,842 | 7/1998 | Murphey | 250/222.1 |
| 5,790,303 | 8/1998 | Weston et al. | 359/345 |
| 5,814,799 | 9/1998 | Swartz et al. | 235/383 |

*Primary Examiner*—Jeffrey A. Hofsass
*Assistant Examiner*—Van T. Trieu
*Attorney, Agent, or Firm*—Parsons & Goltry; Robert A. Parsons; Michael W. Goltry

[57] ABSTRACT

A trigger circuit including a light source supplying a first beam of light having a first frequency, a frequency altering device positionable to receive the first beam of light. The frequency altering device receiving the first beam of light and transmitting a second beam of light having a second frequency. A frequency sensitive component operable in response to the second beam of light having the second frequency, the frequency sensitive component being positioned to receive the second beam of light and provide a trigger signal. A trigger coupled to receive the trigger signal and, upon receipt of the trigger signal, triggering the system. A light filter can be included to transmit the light of the second frequency.

14 Claims, 2 Drawing Sheets

TRIGGER CIRCUIT

FIELD OF THE INVENTION

This invention relates to triggering circuit for triggering the operation of a system.

More particularly, the present invention relates to a triggering circuit dependent on light.

BACKGROUND OF THE INVENTION

There are many systems today, such as automobiles, computers, financial systems, etc. which, for security reasons, require limited or authorized access. Many of these systems operate with keys, cards, etc., which can often either be duplicated or bypassed. It would be advantageous to not only gain access to the system using these devices, but also to provide additional security in the form of a trigger which will actuate the operation of a system upon specific conditions.

Often, access to systems is regulated by very costly and complicated security systems which require coding and comparisons using expensive processing units. For example, security doors include a magnetic strip reader which collects a code from a magnetic strip. The code is compared by a processing unit to stored codes, and then, depending upon the comparison, the processing unit initiates certain activities such as operating the door opening system. Due to the high cost of these security systems, security is often ignored on simple low cost systems.

It would be highly advantageous, therefore, to remedy the foregoing and other deficiencies inherent in the prior art.

Accordingly, it is an object of the present invention to provide a new and improved trigger circuit.

Another object of the present invention is to provide a trigger circuit to enhance security and/or identification in a system.

And another object of the present invention is to provide a trigger circuit which is relatively less costly and can be economically employed on even the simplest systems.

SUMMARY OF THE INVENTION

Briefly, to achieve the desired objects of the instant invention in accordance with a preferred embodiment thereof, provided is a trigger circuit including a light source supplying a first beam of light having a first frequency, a frequency altering device positionable to receive the first beam of light. The frequency altering device receiving the first beam of light and transmitting a second beam of light having a second frequency. A frequency sensitive component operable in response to the second beam of light having the second frequency, the frequency sensitive component being positioned to receive the second beam of light and provide a trigger signal. A trigger coupled to receive the trigger signal and, upon receipt of the trigger signal, triggering the system.

In a specific embodiment the frequency sensitive component includes a photo-transistor, a potentiometer and a JFET coupled to the photo-transistor to adjust the component to be sensitive to the second frequency. The frequency sensitive component can further include a light filtering device which transmits only the second beam of light with the second frequency. The light filtering device is positioned to receive the beam of light from the frequency altering device and the photo-transistor is positioned to receive the second beam of light from the light filtering device and provide a trigger signal in response thereto.

BRIEF DESCRIPTION OF THE DRAWINGS

The foregoing and further and more specific objects and advantages of the instant invention will become readily apparent to those skilled in the art from the following detailed description of preferred embodiments thereof taken in conjunction with the drawings in which.

DESCRIPTION OF THE PREFERRED EMBODIMENT

Figure 1:
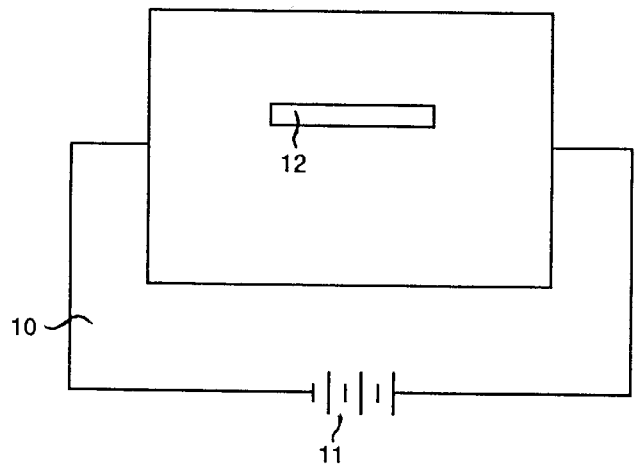
FIG. 1 is a simplified block/schematic diagram of a system to be triggered with a trigger circuit in accordance with the present invention.

Turning now to the drawings, in which like reference characters indicate corresponding elements throughout the several views, attention is first directed to FIG. 1 which illustrates a system 10. System 10 is illustrated schematically as being operated from a power source 11, which is for example a battery, an outlet, etc. In this embodiment, system 10 can be any system in which security and/or identification is desired. Examples of which are secure entry or operating systems (e.g. security badges for opening doors or operating systems), automotive entry or operation, financial identification such as credit or debit cards etc. Much simpler systems, ordinarily not secured, can also benefit from the present invention. System 10 includes a trigger circuit which upon proper stimulation will trigger system 10 to perform it's operations. For purposes of illustration, a receptacle 12 is provided for receiving a detachably portable unit such as a key, a card, or the like as will be described presently.

Figure 2:
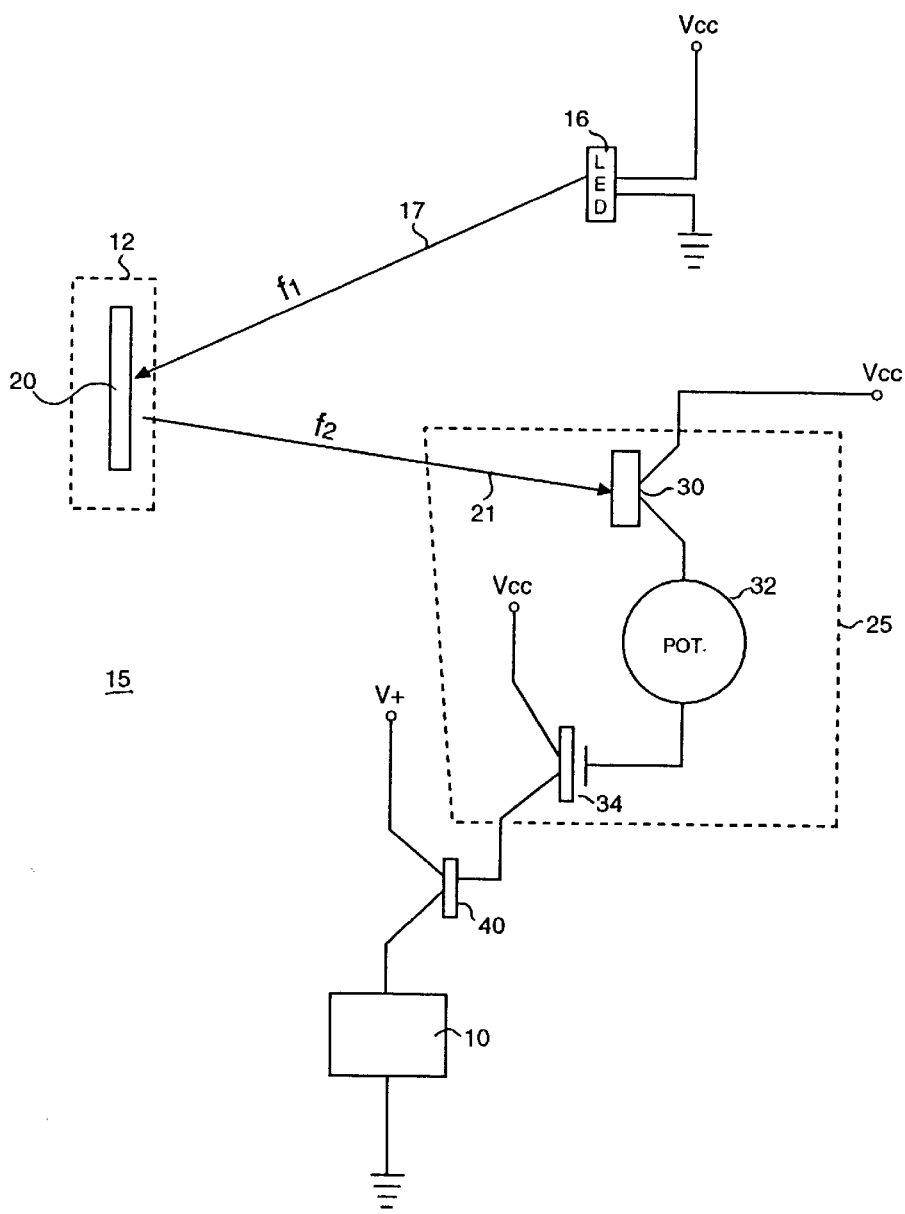
FIG. 2 is a schematic diagram of the trigger circuit of FIG. 1.

Referring now to FIG. 2, a trigger circuit 15 for triggering the operation of system 10, includes a light source 16 coupled to a power source Vcc which may be power source 11 or an independent power source if desired or in specific applications. Light source 16 supplies a light beam 17 including a first frequency $f_1$. Light source 16 is preferably a light emitting diode (LED), laser, or the like, and can be narrow band such as a specific color or wide band such as white light. Light source 16 is positioned in relation to receptacle 12 such that light beam 17 is directed therein.

A frequency altering device 20 is positionable within receptacle 12 to receive light beam 17 from light source 16. Frequency altering device 20 receives light beam 17 and, in response to reception of light beam 17, transmits a light beam 21 having a second frequency. In a preferred embodiment, frequency altering device 20 is incorporated into a key, a card, or any other convenient structure which provides a substrate for support and for convenient use. It will be understood that the terms key and card designate structures for supporting and/or containing the frequency altering device. In the preferred embodiment, frequency altering device 20 includes fluorescent material, such as phosphor or actinical materials, preferably incorporated in a card, a key or the like. Actinical is a dielectric, which includes and encompasses all light reagents, such as silicon, phosphor, fluorescence, radium, platinocyanide; whether chemical, bio, metal, gases, or oxidants; anything acting, responding, or changeable by light radiation. The fluorescent material is preferably applied directly to a substrate. Upon receiving light beam 17, the material of frequency altering device 20 is activated to emit light beam 21 with an altered frequency ($f_2$). Light beam 21 is emitted from receptacle 12.

A frequency sensitive component 25, generally designated by broken line, includes a photo-transistor 30 having a first terminal connected to a power source, such as power source Vcc. A second terminal of photo-transistor 30 is coupled through a potentiometer 32 to the control terminal of a junction field effect transistor (JFET) 34. Here it should be understood that several different frequency sensitive or selective features can be incorporated individually or in combination. For example, photo-transistor 30 can be designed to be sensitive to a single frequency (narrow band) or to a wide band of frequencies. Also, JFET 34 can be designed to be sensitive to a single frequency (narrow band) or to a wide band of frequencies with potentiometer 32 operating in conjunction therewith to provide frequency sensitive or selective operation. It will be understood by those skilled in the art that additional components (not shown for simplicity) may be included to enhance the desired frequency selectivity. The source terminal of JFET 34 is connected to a power source such as Vcc and the drain terminal provides a trigger signal. Frequency sensitive component 25 is adjusted to be sensitive to light beam 21 as long as it has a frequency $f_2$. As discussed previously, frequency $f_2$ can be either a single frequency (narrow band) or a wide band of frequencies and light beam 17 can be only frequency $f_1$ or a wide band of antecedent frequencies. It will be understood that light source 16 and photo-transistor 30 along with any other integrated components, while illustrated as being outside receptacle 12, can be carried within receptacle 12 or can even define an area for receipt of frequency altering device 20 without the use of a receptacle.

A trigger 40, which in this embodiment is illustrated for simplicity as a single transistor, is coupled to frequency sensitive component 25 to receive the trigger signal. In this embodiment, the trigger signal from frequency sensitive component 25 is applied to the base terminal of the single transistor, the collector terminal of which is coupled to a power source V+ and the emitter terminal of which is coupled to system 10. It should be understood that power source V+ can be power source Vcc, power source 11 or any other power source depending upon the specific application. Upon receipt of the trigger signal, trigger 40 activates the operation of system 10. The operation of system 10 is suspended pending a trigger signal resulting from the use of the correct frequency altering device 20. Thus, light beam 17 must be altered to a unique frequency to which frequency sensitive component 25 is adjusted to trigger the operation of system 10. Frequency altering device 20 alters the light beam 17 to provide the necessary unique frequency. It should be understood by those skilled in the art that frequency $f_2$, upon actuating trigger 40, inverts or flip-flops to polarization of system 10, thus canceling $f_2$ in sync-signal synthesis, allowing $f_2$ to maintain a continuous actuating mode, or not, depending on off requirements of system 10. Sync-signal synthesis is electrons reversing direction on convergence of two wavetrains or interference divergence absent incoherence. That is what happens at 40, where $f_2$ becomes reconverted into current flow. It maintains as altered between 30–40 (to distinguish frequency from current carrying between 30–40).

Figure 3:
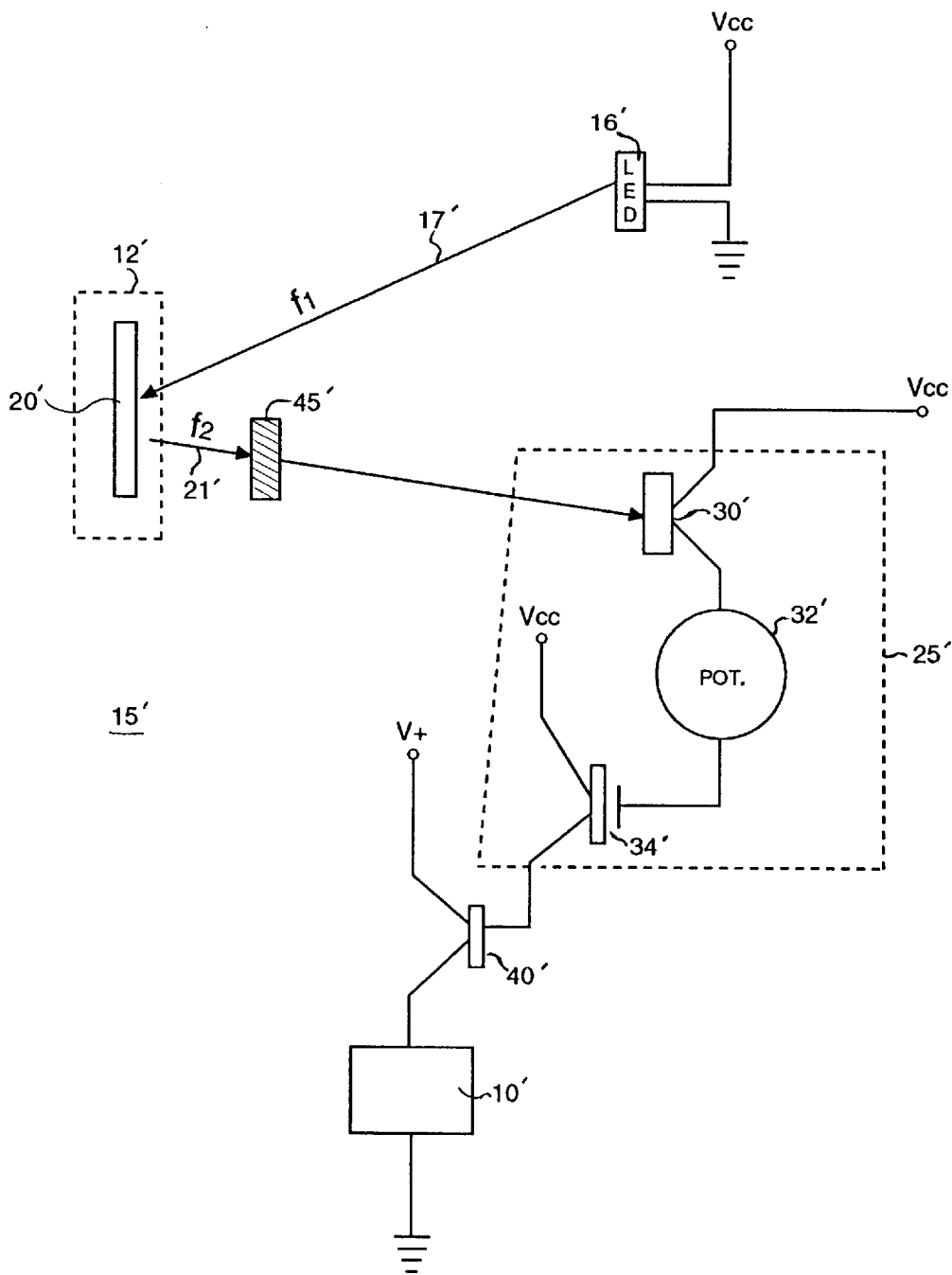
FIG. 3 is a schematic diagram of another embodiment of a trigger circuit according to the present invention.

Turning now to FIG. 3, a schematic diagram is illustrated of another embodiment of a trigger circuit 15' according to the present invention. Components included in FIG. 3 which are similar to components in FIG. 2 are designated with similar numbers having a prime added to indicate the different embodiment. Light source 16' supplies a light beam 17' including a first frequency $f_1$ and is positioned in relation to receptacle 12' such that light beam 17' is directed therein. Frequency altering device 20' is positionable within receptacle 12' to receive light beam 17' from light source 16' and transmit a light beam 21' having a second frequency. A light filtering device 45' is constructed to transmit light only at the second frequency and positioned to receive light beam 21' from the frequency altering device 20'. Light filtering device 45' is or includes a holographic optical element, a light grating, a wavelength filter, or the like. Further, light filtering device 45' may be carried by frequency altering device 20', built into receptacle 12', or included as an element of frequency sensitive component 25'.

Frequency sensitive component 25', generally designated by broken line, includes a photo-transistor 30' having a first terminal connected to a power source, such as power source Vcc. A second terminal of photo-transistor 30' is coupled through a potentiometer 32' to the control terminal of a junction field effect transistor (JFET) 34'. Here it should be understood that several different frequency sensitive or selective features can be incorporated individually or in combination. For example, photo-transistor 30' can be designed to be sensitive to a single frequency (narrow band) or to a wide band of frequencies. Also, JFET 34' can be designed to be sensitive to a single frequency (narrow band) or to a wide band of frequencies with potentiometer 32' operating in conjunction therewith to provide frequency sensitive or selective operation. It will be understood by those skilled in the art that additional components (not shown for simplicity) may be included to enhance the desired frequency selectivity. Conversely, in specific embodiments wherein light filtering device 45' provides frequency selectivity, some of the frequency sensitive component 25' may be altered or omitted to reduce the frequency sensitivity of component 25'. The drain terminal of JFET 34' provides a trigger signal to trigger 40'. Thus, light beam 17' is altered to a unique frequency to which light filtering device 45' and/or frequency sensitive component 25' are adjusted to trigger the operation of system 10'. Frequency altering device 20' alters the light beam 17' to provide the necessary unique frequency.

It should be understood that while we have predominantly discussed security, the disclosed embodiments can also be employed for identification purposes. For example, the present invention can be employed to identify current paper money containing a security strip. Each denomination has a security strip which acts as frequency altering device 20 or 20', fluorescing at different frequencies. Thus, by adjusting frequency sensitive component 25 or light filtering device 45' and frequency sensitive component 25', a system, such as a change maker, can be triggered to operate in response to different denomination bills. Further, by incorporating a plurality of frequency sensitive components 25 or 25', more than one denomination can be accepted. It should also be obvious that while we have predominately discussed security and identification that trigger circuit 15 is in contiguity with system 10, thus, as an independent circuit in accessory it my be applied to adapt and/or convert non-electrical devices to operate electrically and by $f_2$ differentiation without comparisons, i.e., density probes and flow controls.

Various other changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

What is claimed is:

1. A trigger circuit for triggering the operation of a system, the trigger circuit comprising:
   a light source coupled to a power source, supplying a first beam of light having a first frequency;
   a frequency altering device positionable to receive the first beam of light from the light source, the frequency altering device receiving the first beam of light and transmitting a second beam of light having a second frequency;
   a frequency sensitive component operable in response to the second beam of light having the second frequency, the frequency sensitive component being positioned to receive the second beam of light and provide a trigger signal, the frequency sensitive component including a photo-transistor sensitive to light including the second frequency and positioned to receive the beam of light from the frequency altering device, and a potentiometer and a Junction Field Effect Transistor JFET coupled to the photo-transistor to adjust the component to be sensitive to the second frequency; and
   a trigger coupled to receive the trigger signal and, upon receipt of the trigger signal, triggering the system.

2. A trigger circuit as claimed in claim 1 wherein the frequency sensitive component includes a light filtering device which transmits only the second beam of light with the second frequency positioned to receive the beam of light from the frequency altering device.

3. A trigger circuit as claimed in claim 2 wherein the frequency sensitive component further includes a photo-transistor positioned to receive the second beam of light from the light filtering device.

4. A trigger circuit as claimed in claim 3 wherein the filtering device includes a holographic optical element.

5. A trigger circuit as claimed in claim 3 wherein the filtering device includes a light grating.

6. A trigger circuit as claimed in claim 3 wherein the filtering device includes a wavelength filter.

7. A trigger circuit as claimed in claim 3 wherein the frequency altering device is included in a detachably portable unit.

8. A trigger circuit as claimed in claim 7 wherein the detachably portable unit includes one of a card and a key.

9. A trigger circuit as claimed in claim 2 wherein the filtering device is carried by the frequency altering device.

10. A trigger circuit for triggering the operation of a system, the trigger circuit comprising:
    a light source coupled to a power source, supplying a first beam of light having a first frequency;
    a frequency altering device positionable to receive the first beam of light from the light source, the frequency altering device receiving the first beam of light and, in response to reception of the first beam of light, transmitting a second beam of light having a second frequency;
    a frequency sensitive component including a photo-transistor, a potentiometer and a Junction Field Effect Transistor JFET coupled to the photo-transistor to adjust the component to be sensitive to the second frequency, the frequency sensitive component further including a light filtering device which transmits only the second beam of light with the second frequency and positioned to receive the beam of light from the frequency altering device, the photo-transistor being positioned to receive the second beam of light from the light filtering device and provide a trigger signal in response thereto; and
    a trigger coupled to receive the trigger signal and, upon receipt of the trigger signal, triggering the system.

11. A trigger circuit as claimed in claim 10 wherein the filtering device includes one of a holographic optical element, a light grating, and a wavelength filter.

12. A trigger circuit as claimed in claim 10 wherein the filtering device is carried by the frequency altering device.

13. A trigger circuit as claimed in claim 10 wherein the frequency altering device is included in a detachably portable unit.

14. A trigger circuit as claimed in claim 13 wherein the detachably portable unit includes one of a card and a key.

* * * * *